(12) United States Patent
Waddell et al.

(10) Patent No.: US 10,249,554 B2
(45) Date of Patent: Apr. 2, 2019

(54) HEAT TRANSFER ASSEMBLY FOR A HEAT EMITTING DEVICE

(71) Applicant: General Electric Company, Schenectady, NY (US)

(72) Inventors: Alistair Martin Waddell, Munich (DE); Mark Aaron Chan Chan, Munich (DE); Stefan Schroeder, Munich (DE)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/627,477

(22) Filed: Jun. 20, 2017

(65) Prior Publication Data

US 2018/0366391 A1 Dec. 20, 2018

(51) Int. Cl.
*F28D 7/00* (2006.01)
*H01L 23/473* (2006.01)
*G06F 1/20* (2006.01)

(52) U.S. Cl.
CPC ............ *H01L 23/473* (2013.01); *G06F 1/20* (2013.01); *G06F 2200/201* (2013.01)

(58) Field of Classification Search
CPC ... H01L 23/473; G06F 1/20; G06F 2200/201; F28F 3/12
USPC .................................. 165/80.4, 168
See application file for complete search history.

(56) References Cited

U.S. PATENT DOCUMENTS

| | | |
|---|---|---|
| 6,404,628 B1 | 6/2002 | Nagashima et al. |
| 6,892,796 B1 | 5/2005 | Nagashima et al. |
| 7,339,788 B2 | 3/2008 | Olesen et al. |
| 7,360,582 B2 | 4/2008 | Olesen |
| 7,796,388 B2 | 9/2010 | Wiles et al. |

(Continued)

FOREIGN PATENT DOCUMENTS

WO 2016187131 A1 11/2016

OTHER PUBLICATIONS

Valdez, "Tubing Selection for Sealed-for-Life Liquid Cooling Units for Electronics", The Tenth Intersociety Conference on Thermal and Thermo mechanical Phenomena in Electronics Systems ITHERM '06 , http://ieeexplore.ieee.org/document/1645339/, May 30-Jun. 2, 2006, 8 Pages.

(Continued)

*Primary Examiner* — Davis D Hwu
(74) *Attorney, Agent, or Firm* — GE Global Patent Operation; Nitin Joshi

(57) ABSTRACT

A heat transfer assembly useful for dissipating heat from the heat emitting device is disclosed. The assembly includes a module inlet for receiving a coolant, at least one module having a first part with a recess to receive a portion of the heat emitting device, and a second part having a shaped cutout portion and a solid portion, where the second part allows a uniform compression of a seal component disposed on the first part. The first part and the second part are mechanically connected to each other; and a module outlet is used for discharging a heat absorbed coolant after absorbing heat from the heat emitting device, where the at least one module is connected to the module inlet and the module outlet. In another embodiment, multiple modules are configured in a symmetrical layout to provide a balanced flow of the coolant in the heat transfer assembly.

14 Claims, 9 Drawing Sheets

(56) References Cited

U.S. PATENT DOCUMENTS

| | | |
|---|---|---|
| 8,451,609 B2 | 5/2013 | Olesen et al. |
| 2005/0195574 A1* | 9/2005 | Chiba .................. H01L 23/473 |
| | | 361/709 |
| 2006/0126308 A1 | 6/2006 | Campbell et al. |
| 2008/0285230 A1 | 11/2008 | Bojan et al. |
| 2010/0175857 A1 | 7/2010 | Gerstler et al. |
| 2014/0352937 A1* | 12/2014 | Draht ........................ G06F 1/20 |
| | | 165/168 |
| 2015/0195951 A1 | 7/2015 | Long et al. |
| 2016/0351468 A1 | 12/2016 | Liang |

OTHER PUBLICATIONS

Harder et al., "Direct Liquid Cooling of Power Electronics Devices", 4th International Conference on Integrated Power Systems (CIPS), http://ieeexplore.ieee.org/abstract/document/5758077/, Jun. 7-9, 2006, 6 Pages.

Extended European Search Report and Opinion issued in connection with corresponding EP Application No. 18176970.4 dated Nov. 26, 2018.

\* cited by examiner

HEAT TRANSFER ASSEMBLY FOR A HEAT EMITTING DEVICE

BACKGROUND

Embodiments of the present disclosure relate to a heat transfer assembly required for cooling a heat emitting device, such as a power electronic devices or for cooling multiple heat emitting devices.

Traditionally in liquid cooling of heat emitting devices such as the power electronic devices, the devices are mounted on a cooling plate, referred generally as a cold-plate which is subjected to an internal, single-phase fluid flow of a liquid coolant. Heat generated by the electronic device is conducted through three layers that include, an electronic device baseplate, a Thermal Interface Material (TIM), and the cold-plate body. Finally, the heat is convected into the liquid coolant and transported downstream, to be rejected to ambient.

There exist different solutions that provide different structures to achieve the cooling described herein above. Some improvements to this cooling also include direct cooling solutions where the TIM layer and the cold-plate body conduction layers are removed and the coolant flow is applied to the baseplate of the power electronic device.

However, the direct cooling designs often suffer from leak related issues that cause damage to the power electronic device and is a serious reliability concern in the manufacturing of these cooling solutions. Further, some of these designs also suffer from coolant flow distribution issues. Usually, a single pump is used to drive the coolant through multiple flow paths. In several designs, the flow is imbalanced, when one path has a different resistance to coolant flow than the others. Another concern is a water hammer effect in some designs which arises when a high velocity flow bypasses some paths, and creates a much higher flowrate through the final path.

Thus, effective sealing and proper flow distribution of the coolant continue to be some challenges in the cooling solutions for heat emitting devices.

BRIEF DESCRIPTION

In one aspect, a heat transfer assembly coupled to a heat emitting device for dissipating heat from the heat emitting device is disclosed. The heat transfer assembly includes a module inlet for receiving a coolant; at least one module comprising a first part having a recess to receive a portion of the heat emitting device, and a second part having a shaped cutout portion and a solid portion, wherein the second part allows a uniform compression of a seal component disposed on the first part, and wherein the first part and the second part are mechanically connected to each other; and a module outlet for discharging a heat absorbed coolant after absorbing heat from the heat emitting device, where the at least one module is connected to the module inlet and the module outlet.

In another embodiment, the heat transfer assembly includes multiple modules arranged in a symmetrical layout to allow a symmetrical flow of the coolant in the heat transfer assembly.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The different aspects of a heat transfer assembly described herein relate to reliable cooling arrangement for any heat emitting devices that produce heat during their operation. One such device is a power converter device that uses semiconductor based circuitry. Power Converters typically comprise semiconductor switches optionally in combination with other circuitry such as diodes, capacitors, and/or inductors. The heat transfer assembly described herein is particularly beneficial for power converters including silicon carbide switches due to the high heat fluxes associated with such switches. The different aspects described herein focus on geometry of the heat transfer assembly that enables uniform compression of a sealing component that is used to seal the heat emitting device with the heat transfer device and consequently solves any leak related issues that otherwise occur as explained herein above.

The different embodiments also address other aspects related to heat transfer assembly, such as providing a symmetrical flow path for the coolant, that further enhances the reliable operation of the heat transfer assembly. These embodiments provide simplicity for facile manufacturing without introducing new components, and the materials used for fabrication of the heat transfer assembly provide an electrically insulating structure where the electromagnetic interferences (EMI) in the heat emitting device are also reduced, thereby improving the operation of the heat emitting device as well.

Figure 1A:
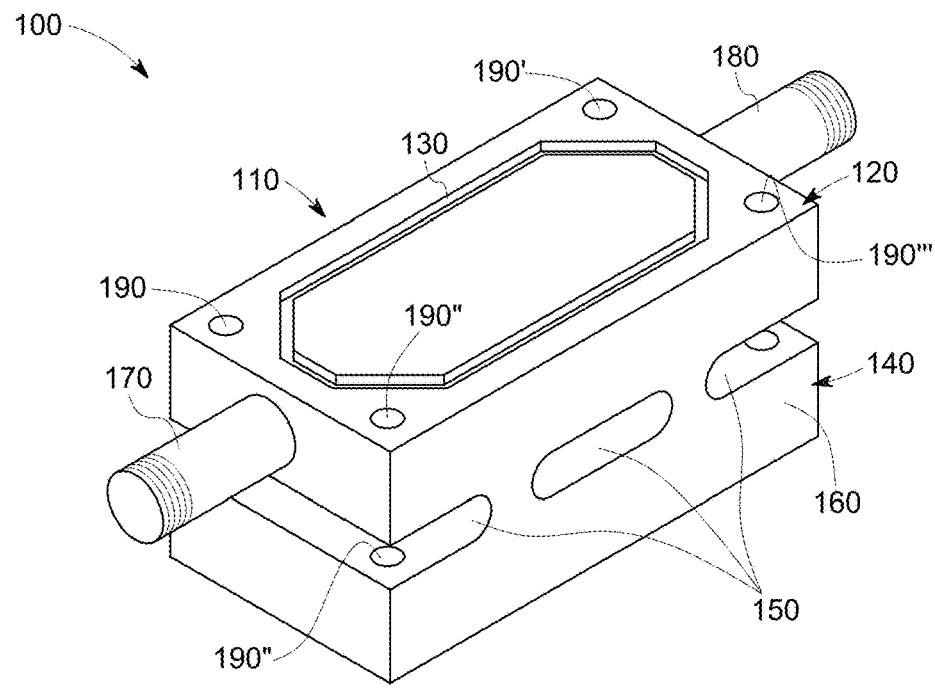
FIG. 1A is an example implementation of an embodiment of a heat transfer assembly for transferring heat from a heat emitting device.
Figure 1B:
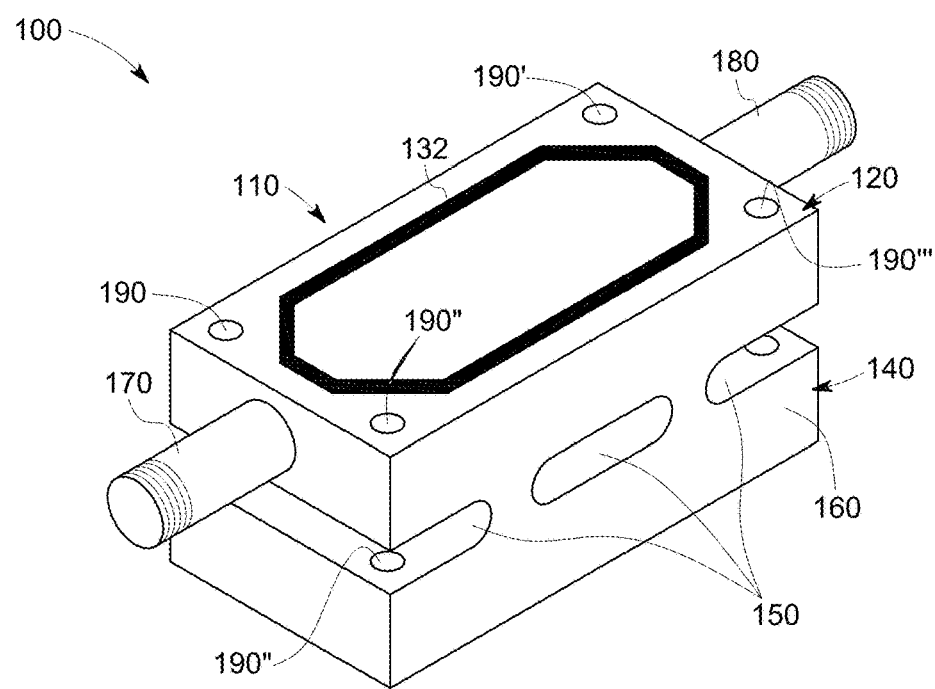
FIG. 1B is an example implementation of the embodiment of FIG. 1A with a sealing component.

FIG. 1A is a non-limiting implementation of an embodiment of a heat transfer assembly 100 for transferring heat from an heat emitting device (not shown in FIG. 1A, however is shown in FIG. 8). The heat transfer assembly 100 includes at least one module shown as 110, that has a first part 120 having a recess 130 to receive a portion of the heat emitting device, and a seal component disposed in the recess (shown in FIG. 1B), and a second part 140 having a shaped cutout portion 150 and a solid portion 160. It would be appreciated by those skilled in the art that the second part 140 allows a uniform compression of the sealing component, thus provides a leak-proof sealing for the seal component disposed between the heat emitting device and the module and thus prevents an occurance of leak that can damage the heat emitting device. It may be noted here, that the module 110 is flexible (to the order of 1 mm) to achieve a convex curvature or a concave curvature for load balance to ensure uniform compression for the leak-proof sealing. The seal component referred herein in one example is an o-ring seal, and a gasket in another example, and is shown in FIG. 1B by reference numeral 132. It may be noted here that the sealing component (o-ring, gasket, etc.) could be a separate component, or it could even be integrated into the module through additive manufacturing methods. Other components in FIG. 1B are same as shown and described in reference to FIG. 1A. Further details related to compression of the sealing component are described in more detail in reference to FIG. 2A-2F.

In different embodiments described herein, the first part 110 and the second part 130 are mechanically connected to each other. In some embodiments, for example the embodiment of FIG. 1A, the first part 120 and the second part 140 are fabricated as a single integrated unit. The heat transfer assembly 100 shown in FIG. 1A further includes a module inlet 170 for receiving a coolant and a module outlet 180 for discharging the heat absorbed coolant. The coolant is typically a liquid coolant such as water, de-ionised water, water-glycol, and fluoroketones like Novec 649TM for the phase change applications. The module inlet 170 and module outlet 180 are coupled to the portion of recess 130 underlying the heat emitting device such that that the coolant touches the portion of the heat emitting device (also sometimes referred to as a baseplate) directly and therefore achieves efficient and effective cooling for the heat emitting device.

Further, the coolant in one example is a single phase coolant, which implies that the liquid coolant remains liquid even after absorbing heat from the heat transfer device. In another example, the coolant is a phase change coolant, which implies that the liquid coolant changes into vapor after absorbing heat from the heat transfer device.

The heat transfer assembly also includes holes for example 190, 190', 190", 190''' that are seen in the drawing, for receiving respective bolts (not shown) for securing the heat emitting device mechanically with the heat transfer assembly 110. It would be understood by those skilled in the art that the desired portion of the heat emitting device is bolted to the respective module using these bolts, where each bolt passes through the first part 120 and the second part 140.

FIG. 2A-2F further show free body diagrams to explain the non-uniform compression of the sealing component in some prior art designs, as well as the free body diagrams related to embodiments of this disclosure that provide uniform compression of the sealing components. As is seen in the free body diagram 200 of prior art designs, shown in FIG. 2A, a leak occurs at the center 210 of the module 220 (the point farthest from the bolts) due to a long distance which spans the clamping bolts, the clamping force of bolts is shown by the arrows 230 and 240, and the offset force is shown by 250 and 260. Thus, the center 210 becomes weak over time and that leads to a leak through the sealing component.

Figure 2A:
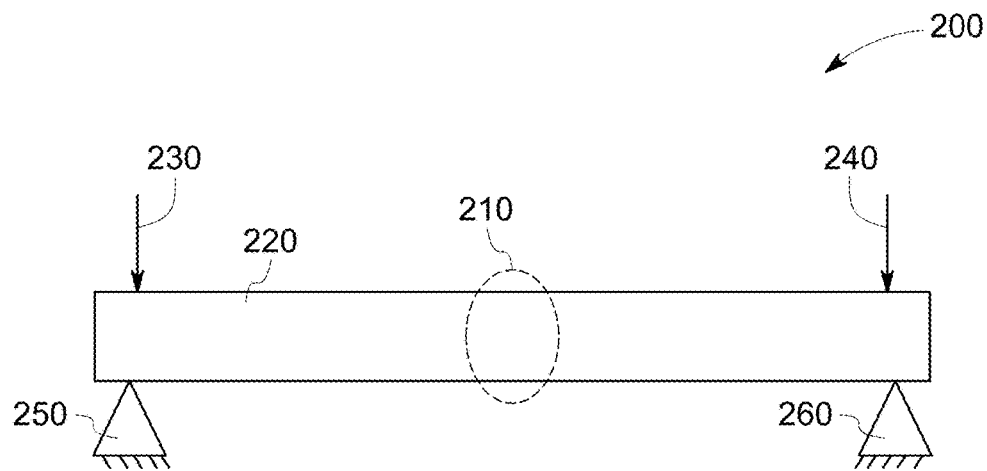
FIG. 2A is a free body diagram to explain non-uniform compression of a sealing component used in prior art.
Figure 2B:
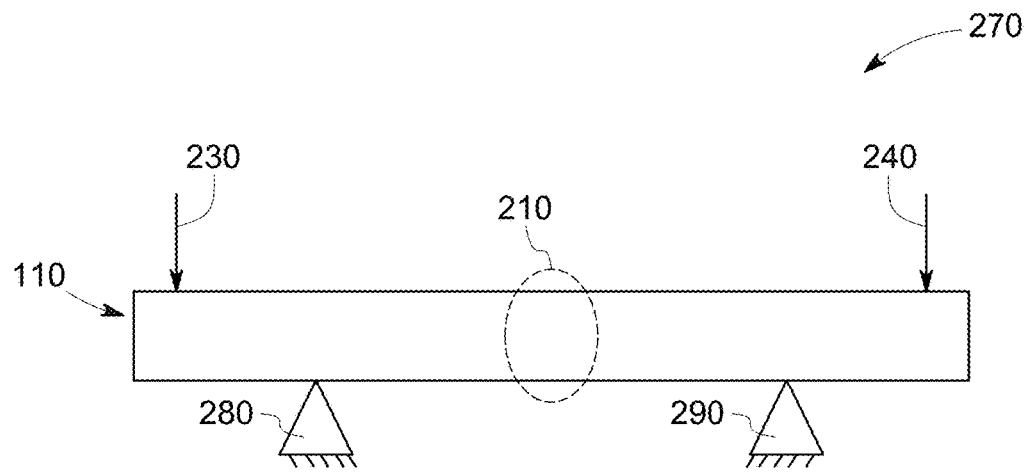
FIG. 2B-2F are free body diagrams to show uniform compression in the different implementations of the heat transfer assembly described herein.

FIG. 2B shows the modified free body diagram 270 for the different embodiments described herein where the reaction forces 230 and 240 applied by bolts and nuts are offset by introducing a four-point bending shown by offset forces 280 and 290, which provides uniform O-ring compression.

Figure 2C:
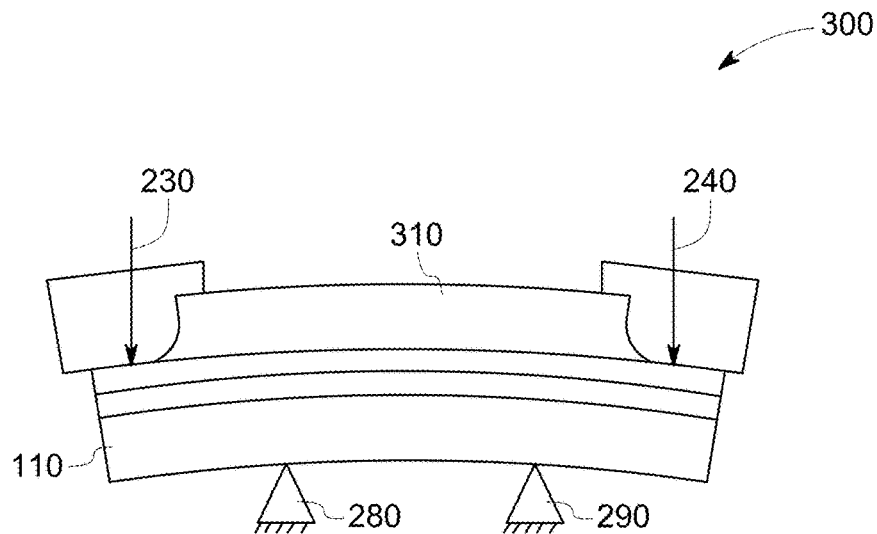
Figure 2D:
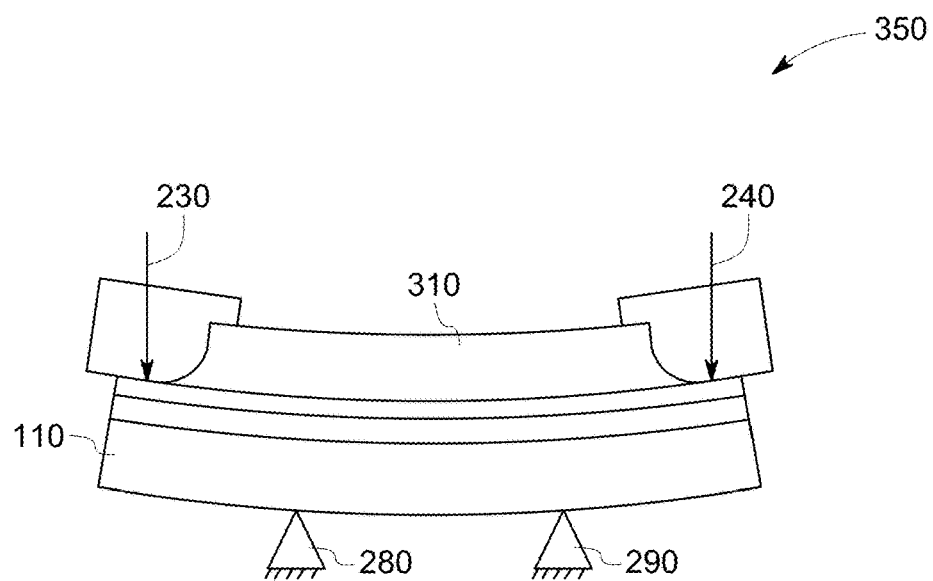
Figure 2E:
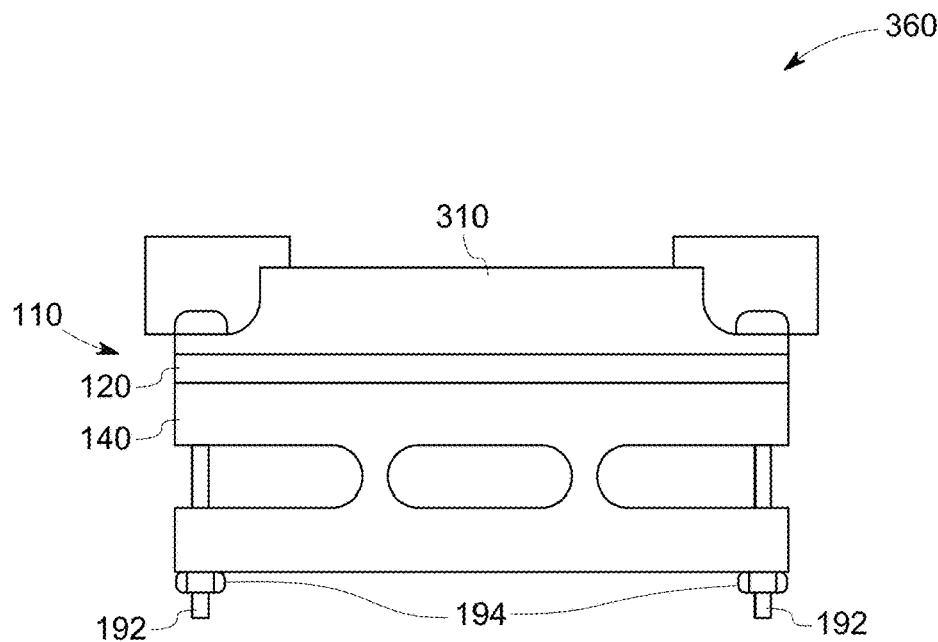

The module 110 of the heat transfer assembly described in different embodiments is therefore able to flex due to the four-point bending and accommodate a concave curvature, as shown diagram 300 in FIG. 2C or a convex curvature, as shown in diagram 350 in FIG. 2D. The free body diagram 360 in FIG. 2E shows one embodiment where a single module that implements the features of FIG. 2B-FIG. 2D. FIGS. 2C-2D also show is the portion of the heat emitting device indicated by reference numeral 310. FIG. 2E shows nuts 194 and bolts 192 that are used to attach the module 110 with a portion of the heat emitting device shown by reference numeral 310.

Figure 2F:
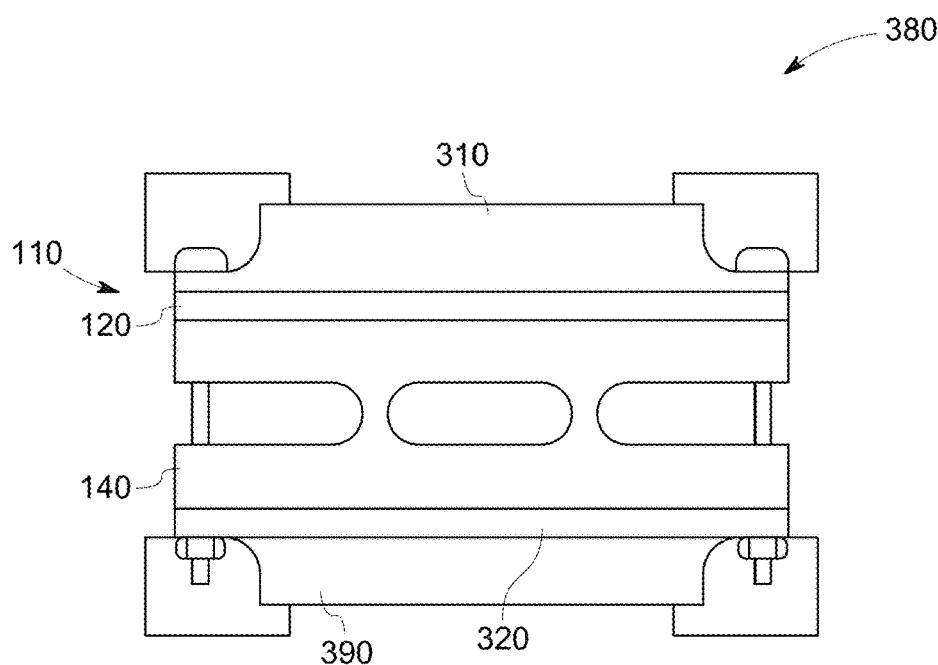

FIG. 2F shows another embodiment 380 where a double-sided component implements the features of FIG. 2B-FIG. 2D. It would be appreciated by those skilled in the art, that in this embodiment the module includes a third part 320 in addition to the first part 120 and the second part 140, described in reference to FIG. 1. The second part 140 is disposed between the first part 120 and the third part 320, and the third part 320 is a mirror of the first part. 120 In this particular embodiment, the heat emitting devices 310 and 390, such as power converters can be positioned on both sides as the first part and the third part, both become accessible for receiving the power converters and the second part provides the required cooling to both the power converters that are positioned on top of the first part and the third part. It would be understood by those skilled in the art that in this configuration, the bolts will pass through the first part, the second part, and the third part and the power converter, or any other heat emitting device.

Figure 3:
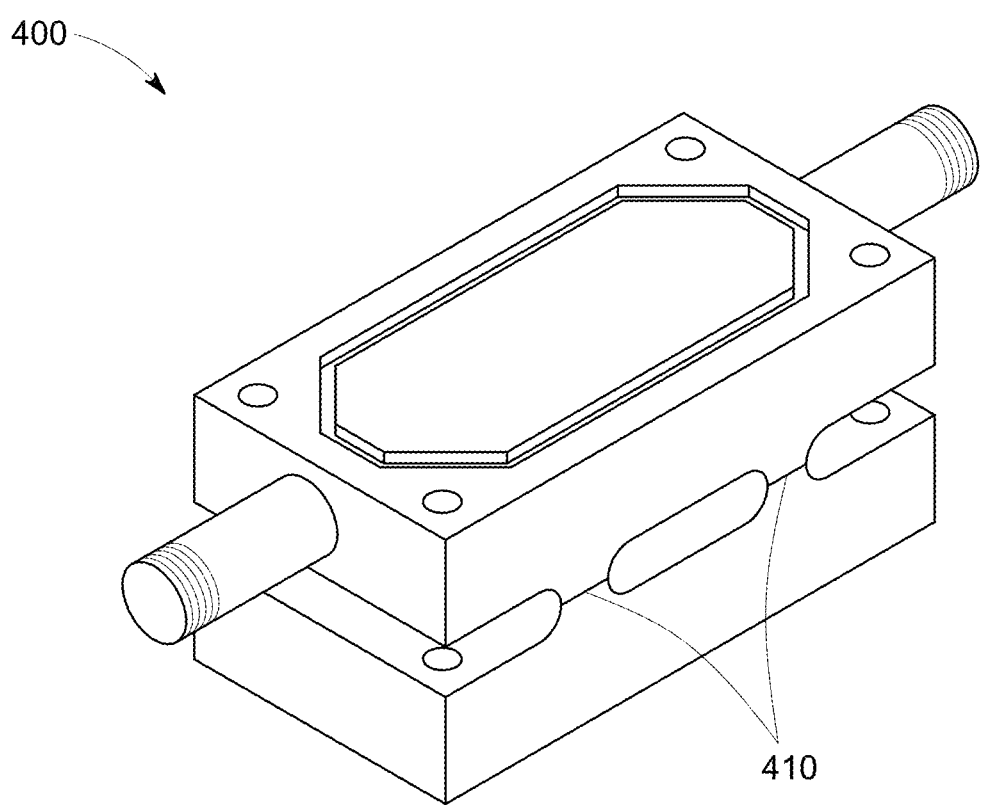
FIG. 3 is a diagrammatic representation of a heat transfer assembly showing a snap fit arrangement between the first and second part of a module of the heat transfer assembly.

It would be appreciated by those skilled in the art that the first part and second part or first part, second part and third part can be all in one integrated unit as mentioned earlier or in some other embodiments, for example an embodiment 400 as shown in FIG. 3, these parts, for example the first part and the second part may use a snap fit, using grooves for example to connect to each other, as indicated by reference numeral 410. The other components in FIG. 3 are same as in FIG. 1

Figure 4:
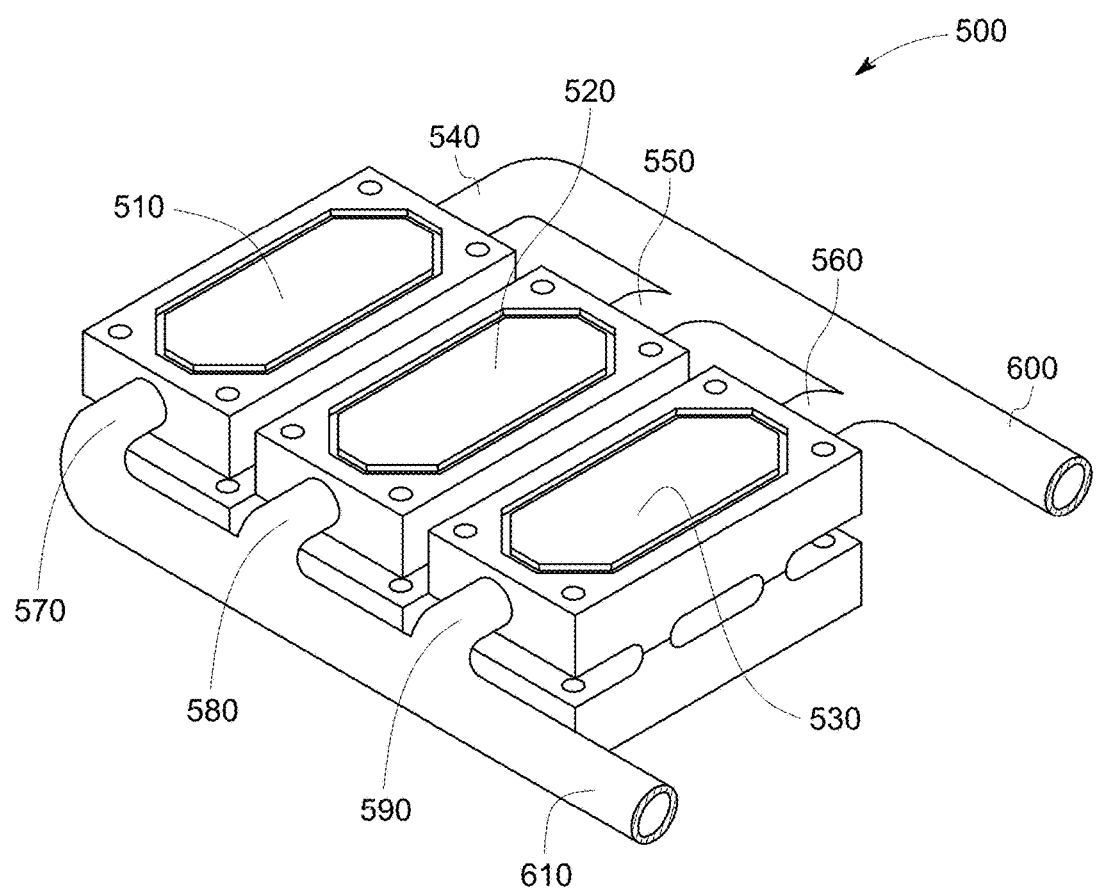
FIG. 4 is a top view of an example implementation of another embodiment of the heat transfer assembly with linearly arranged modules.

Now turning to FIG. 4, a diagrammatic representation 500 of another embodiment is disclosed where the heat transfer assembly has multiple modules 510, 520, 530 arranged in a linear array, each module having a respective module inlet shown by reference numeral 540, 550, 560 and respective outlet shown by reference numeral 570, 580, and 590 and all the modules connected to a tubing with an assembly inlet 600 and an assembly outlet 610 for providing flow path for the coolant.

Figure 5:
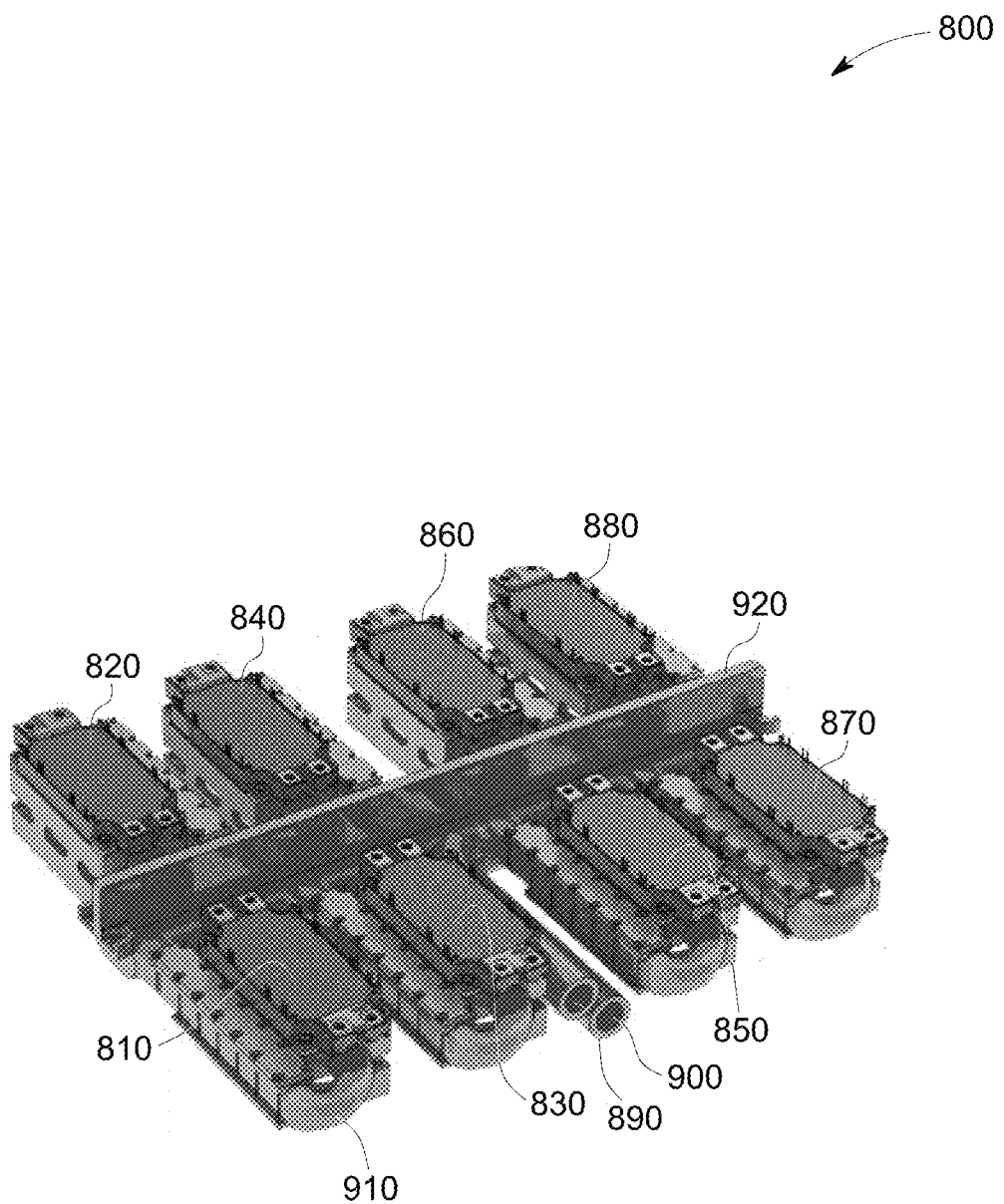
FIG. 5 is a diagrammatic representation of yet another embodiment of the heat transfer assembly with a symmetrical module layout.

FIG. 5 is a diagrammatic representation 800 of another embodiment with eight individual modules in one integrated unit, where modules 810, 830 are a mirror of modules 820 and 840 respectively, and modules 850 and 870 are mirror of modules 860 and 880 respectively. Also, the modules 810, 830, 850, 870 are all on one side, whereas the mirror modules 820, 840, 860, and 880 are on the other side separated by a separator 920 A distributed tubing 910 allows the assembly inlet 890 and the assembly outlet 900 to be connected to individual module inlet and module outlet as shown.

Figure 6:
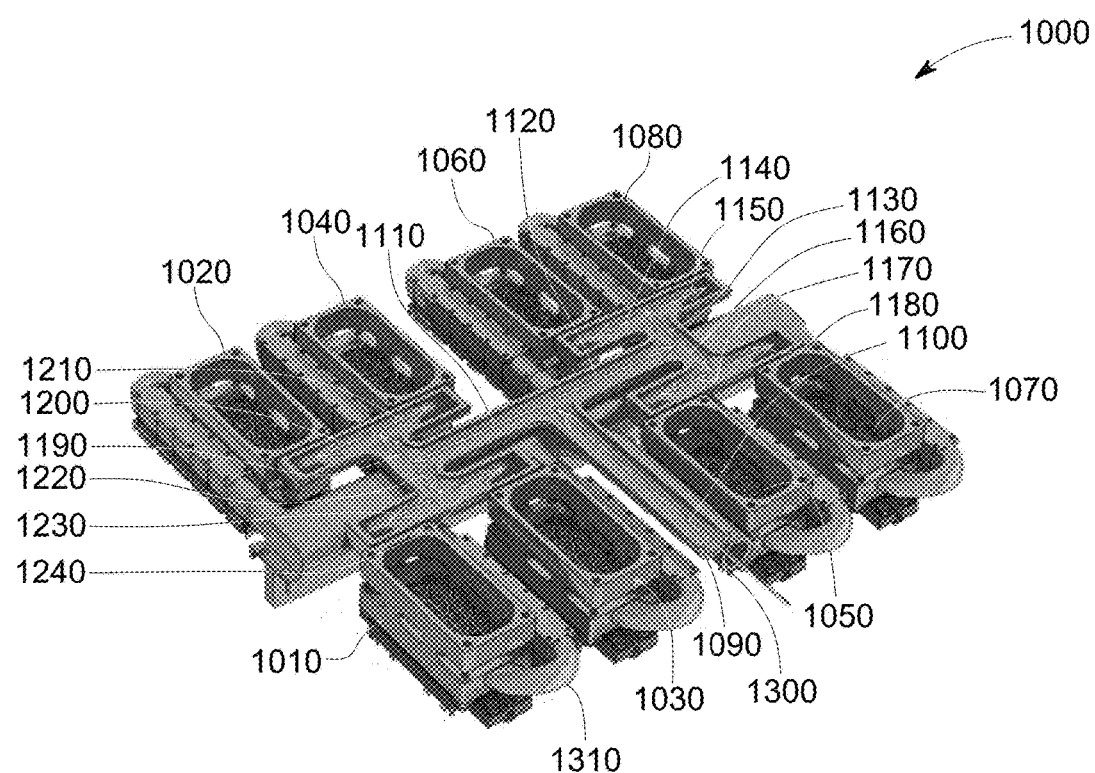
FIG. 6 is a diagrammatic representation of yet another embodiment of the heat transfer assembly showing a symmetrical flow path for a coolant.

FIG. 6 is another diagrammatic representation 1000 where the multiple modules 1010, 1030, 1050, 1070 and mirror modules 1020, 1040, 1060, 1080 are arranged such that there is a symmetrical layout to allow a symmetrical flow direction for the coolant in the heat transfer assembly 1000 from the inlet 1090 through the flow channels to enter the respective module inlets of each of the modules, and similarly provides a symmetrical flow path for exit of the coolant through each of the module outlet into the outlet 1300 of the heat transfer assembly 1000. A distributed tubing 1310 provides connection of the assembly inlet with each of the module inlet and of each of module outlet with the assembly outlet of the heat transfer assembly.

The symmetrical flow of the coolant ensures that there is no build up of coolant in any one of the modules with respect to others, and retains a balanced flowpath throughout the heat transfer assembly. As shown, the flow splits in half three times, effectively disrupting the water hammer which is known to cause flow imbalances in prior art designs. The first time the flow splits as indicated by arrows 1100, 1110, 1120; the second time there is a two way symmetrical split, shown by arrows 1130, 1140, and 1150 on one side, and the arrows 1190, 1200, and 1210 on the other side; and there is a third symmetrical split shown by arrows 1160, 1170, 1180 on one side, and 1220, 1230, and 1240 on the other side. As is seen in FIG. 6, the symmetrical layout makes the flow path from the inlet to each individual module similar. This makes the flow resistance in each individual module similar, and achieves balanced flow distribution as mentioned herein above.

Figure 7:
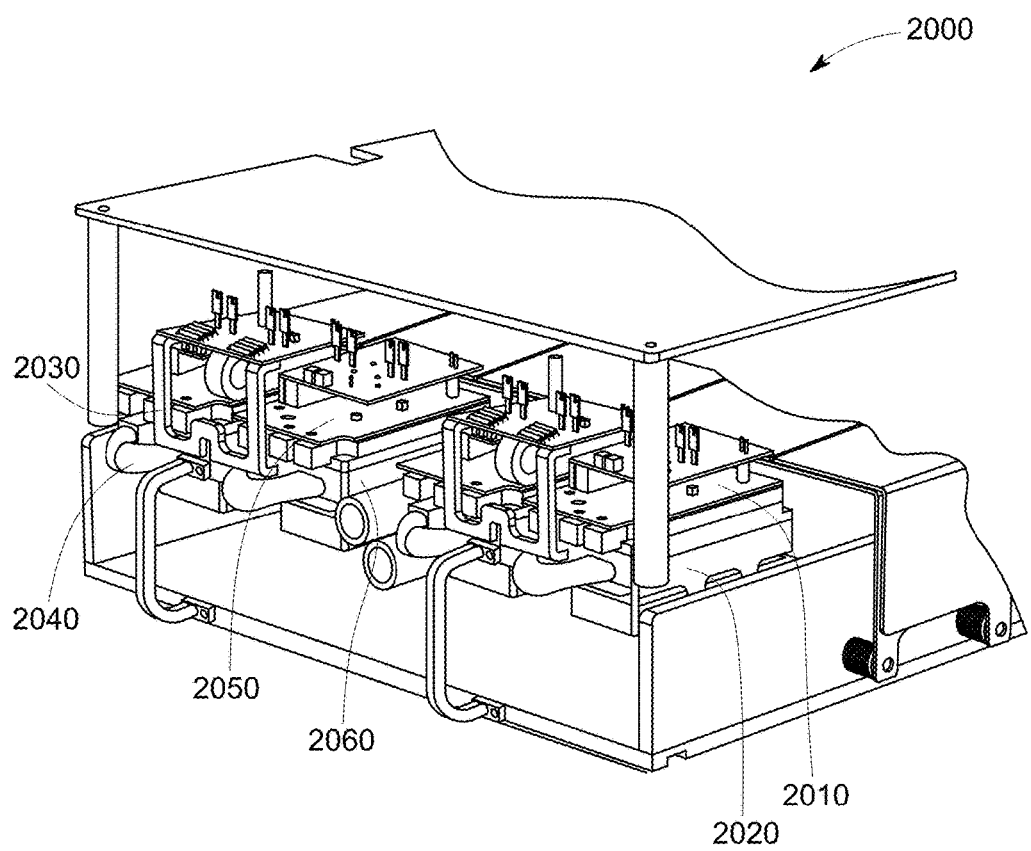
FIG. 7 is a diagrammatic representation of an embodiment of heat transfer assembly with the heat emitting device.

Turning now to FIG. 7, a diagrammatic representation 2000 shows a power converter drive with different power converters 2010, 2030, 2050 positioned on top of the respective modules 2020, 2040, and 2060 of the respective heat transfer assemblies explained in reference to above embodiments, for example embodiments of FIG. 5 and FIG. 6.

The individual module or the multiple modules described herein are made from at least one of a polymer material, copolymer material or a composite material, such as polymer-ceramic composite, carbon fibre composite, other non-metals, metals and alloys. In some embodiments the entire heat transfer assembly is made from a same material. Further other materials that are compatible with faster manufacturing techniques such as three dimensional printing will also be suitable for the multiple modules described herein.

Thus, the different embodiments of the modules of the heat transfer assembly described herein achieve effective cooling through direct contact of the coolant with the heat emitting device and in addition the modules ensure a leak proof sealing to overcome non-uniform compression of the sealing component, that is critical for heat emitting devices such as power converters and an enabler for direct liquid cooling of heat emitting devices.

This sealing concept is an enabler for direct liquid cooling, which will reduce the thermal resistance from the power converter device (for example a semiconductor chip) to air by ~20 deg C./kW (degree Centigrade/kilo Watt). This implies, that the power converter device will have a greater power rating for the same junction temperature, or alternately a more efficient power conversion (lower junction temperature) for the same power rating. Further, since a high thermal conductivity material is no longer required in the heat transfer assembly described herein, it can be manufactured from an economical polymer or composite material. Such materials are good insulators, and therefore serve the function of thermal insulation along with providing structural support. The insulating structure will also reduce EMI, since the large antenna-like active heatsinks are not required that cause EMI in prior art designs. Thus, several components in the prior art cooling arrangements, such as heatsink, TIM, and accompanying isolating components are made redundant through the different embodiments described herein, enabling a simpler, more compact cooling design with lower labor cost for assembly.

The embodiments of the heat transfer assembly described herein also achieve a symmetric flow path for the coolant to avoid any pressure build-up due to non-uniform flow build-up in the flow path for the coolant.

It would be appreciated by those skilled in the art that the modular structure of the heat transfer assembly described herein makes it compatible for additive manufacturing. In one implementation, the heat transfer assembly is additively manufactured and is injection molded in another implementation, which allow complex, three dimensional geometries for internal flow paths (relative to prior art machined aluminum designs).

It would be appreciated by those skilled in the art, that though the heat transfer assembly has been described herein in relation to cooling of power converter devices as heat emitting devices, however, there the heat emitting devices could be any semiconductor based devices or circuits, these may be a part of computer processing equipment, or electrical motors and generators, or any devices that generate heat during their operation and require cooling for safe operation of their components.

It would be further understood that not necessarily all such objects or advantages described above may be achieved in accordance with any particular embodiment. Thus, for example, those skilled in the art will recognize that the systems and techniques described herein may be embodied or carried out in a manner that achieves or improves one advantage or group of advantages as taught herein without necessarily achieving other objects or advantages as may be taught or suggested herein.

While the technology has been described in detail in connection with only a limited number of embodiments, it should be readily understood that the specification is not limited to such disclosed embodiments. Rather, the technology can be modified to incorporate any number of variations, alterations, substitutions or equivalent arrangements not heretofore described, but which are commensurate with the spirit and scope of the claims. Additionally, while various embodiments of the technology have been described, it is to be understood that aspects of the specification may include only some of the described embodiments. Accordingly, the specification is not to be seen as limited by the foregoing description, but is only limited by the scope of the appended claims.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A heat transfer assembly coupled to a heat emitting device for dissipating heat from the heat emitting device, the heat transfer assembly comprising:
   a module inlet for receiving a coolant;
   at least one module comprising a first part having a recess to receive a portion of the heat emitting device, and a second part having a shaped cutout portion and a solid portion;
   a sealing component disposed between the heat emitting device and the at least one module;
   a module outlet for discharging a heat absorbed coolant after absorbing heat from the heat emitting device, wherein the at least one module is connected to the module inlet and the module outlet, wherein the second part allows a uniform compression of the seal component, and wherein the first part and the second part are mechanically connected to each other; and wherein the at least one module is flexible to achieve a convex curvature or a concave curvature for load balance for leak-proof sealing.

2. The heat transfer assembly of claim 1 wherein the coolant is at least one of a single phase coolant or a phase change coolant.

3. The heat transfer assembly of claim 1 wherein the shaped cutout portion and the solid portion in the second part enable a four-point bending for uniform compression of the sealing component.

4. The heat transfer assembly of claim 1 comprising a plurality of modules arranged in a symmetrical layout to allow a symmetrical flow of the coolant in the heat transfer assembly.

5. The heat transfer assembly of claim 3 further comprising an assembly inlet for receiving the coolant, wherein the symmetrical layout provides flow direction for the coolant to enter each of the plurality of modules; and an assembly outlet for discharging the heat absorbed coolant received from the plurality of modules, wherein the assembly inlet and the assembly outlet are connected to the module inlet and the module outlet of each module of the plurality of the modules through a distributed tubing.

6. The heat transfer assembly of claim 1 wherein the first part and the second part are integrated as a single unit.

7. The heat transfer assembly of claim 1, wherein the first part and the second part use a snap fit configuration to mechanically connect with each other.

8. The heat transfer assembly of claim 1 wherein the at least one module is made from at least one of a polymer material or a composite material.

9. The heat transfer assembly of claim 1 wherein the portion of the heat emitting device is bolted to the at least one module using a plurality of bolts, wherein each bolt passes through the first part and the second part.

10. The heat transfer assembly of claim 1 further comprising a third part, wherein the second part is disposed between the first part and the third part, and wherein the third part is a mirror of the first part.

11. The heat transfer assembly of claim 10 wherein the portion of the heat emitting device is bolted to the at least one module, wherein each bolt passes through the first part, the second part, and the third part.

12. The heat transfer assembly of claim 1 wherein the heat emitting device is a power converter.

13. The heat transfer assembly of claim 12 wherein the power converter comprises silicon carbide switches.

14. A heat transfer assembly coupled to a heat emitting device for dissipating heat from the heat emitting device, the heat transfer assembly comprising:
 a module inlet for receiving a coolant;
 at least one module comprising a first part having a recess to receive a portion of the heat emitting device, and a second part having a shaped cutout portion and a solid portion;
 a sealing component disposed between the heat emitting device and the at least one module;
 a module outlet for discharging a heat absorbed coolant after absorbing heat from the heat emitting device, wherein the at least one module is connected to the module inlet and the module outlet;
 a third part, wherein the second part is disposed between the first part and the third part, and wherein the third part is a mirror of the first part;
wherein the second part allows a uniform compression of the seal component, and wherein the first part and the second part are mechanically connected to each other.

* * * * *